(12) United States Patent
Hong

(10) Patent No.: US 9,093,419 B2
(45) Date of Patent: Jul. 28, 2015

(54) SEMICONDUCTOR DEVICE CONTAINING MIM CAPACITOR AND FABRICATION METHOD

(71) Applicant: Semiconductor Manufacturing International (Shanghai) Corporation, Shanghai (CN)

(72) Inventor: Zhongshan Hong, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/177,570

(22) Filed: Feb. 11, 2014

(65) Prior Publication Data

US 2014/0291805 A1    Oct. 2, 2014

(30) Foreign Application Priority Data

Apr. 2, 2013    (CN) .......................... 2013 1 0113290

(51) Int. Cl.
*H01L 21/20*    (2006.01)
*H01L 49/02*    (2006.01)
*H01L 23/522*    (2006.01)

(52) U.S. Cl.
CPC ............ *H01L 28/40* (2013.01); *H01L 23/5223* (2013.01)

(58) Field of Classification Search
CPC ........................... H01L 28/40; H01L 23/5223
USPC ........................................... 438/396; 257/532
See application file for complete search history.

(56) References Cited

U.S. PATENT DOCUMENTS

| | | | |
|---|---|---|---|
| 6,391,763 B1 * | 5/2002 | Liu | 438/622 |
| 2003/0178666 A1 * | 9/2003 | Lee et al. | 257/306 |
| 2004/0061177 A1 * | 4/2004 | Merchant et al. | 257/349 |
| 2009/0200638 A1 * | 8/2009 | Smith | 257/532 |

* cited by examiner

*Primary Examiner* — Nicholas Tobergte
(74) *Attorney, Agent, or Firm* — Anova Law Group, PLLC

(57) ABSTRACT

A semiconductor device containing an MIM capacitor and its fabrication method are provided. A metal-insulator-metal (MIM) capacitor is formed on a first interlayer dielectric layer covering a substrate. The MIM capacitor includes a bottom electrode layer and a top electrode layer that are isolated from and laterally staggered with one another. A second interlayer dielectric layer is formed to cover both the MIM capacitor and the first interlayer dielectric layer. A first conductive plug and a second conductive plug are formed each passing through the second interlayer dielectric layer. The first conductive plug contacts a sidewall and a surface portion of the top electrode layer of the MIM capacitor and the second conductive plug contacts a sidewall and a surface portion of the bottom electrode layer of the MIM capacitor.

16 Claims, 6 Drawing Sheets

SEMICONDUCTOR DEVICE CONTAINING MIM CAPACITOR AND FABRICATION METHOD

CROSS-REFERENCES TO RELATED APPLICATIONS

This application claims the priority to Chinese Patent Application No. CN201310113290.6, filed on Apr. 2, 2013, which is incorporated herein by reference in its entirety.

FIELD OF THE DISCLOSURE

The present disclosure generally relates to the field of semiconductor technology and, more particularly, relates to semiconductor devices containing metal-insulator-metal (MIM) capacitors and methods for making the same.

BACKGROUND

A capacitor is a passive electronic device commonly used in integrated circuits (ICs) such as radio frequency ICs, and monolithic microwave ICs. Common capacitors include a metal-oxide-semiconductor (MOS) capacitor, P-N junction capacitor, MIM (i.e., metal-insulator-metal) capacitor, etc. MIM capacitor is more widely used, particularly for mixed-signal and radio frequency (RF) applications, because it exhibits low interference with transistor and provides better linearity and symmetry.

Referring to FIG. 1, currently, a semiconductor device containing an MIM capacitor includes: a dielectric layer 10, a first metal layer 11 on surface of the dielectric layer 10, an interlayer dielectric layer 20 on the first metal layer 11 and on the surface of dielectric layer 10, an MIM capacitor 27 inside the interlayer dielectric layer 20, and a second metal layer 31 on the surface of interlayer dielectric layer 20. The MIM capacitor 27 includes a bottom electrode layer 24, a top electrode layer 26 opposite to the bottom electrode layer 24, and a dielectric layer 25 between the bottom electrode layer 24 and the top electrode layer 26. The top electrode layer 26 connects to the second metal layer 31 through a conductive plug 22 and the bottom electrode layer 24 connects to the first metal layer 11 through a conductive plug 21. A conductive plug 23 is inside the interlayer dielectric layer 20 to connect the second metal layer 31 with the first metal layer 11.

However, it is still desirable to improve performance of conventional semiconductor devices containing MIM capacitors. There is a need to provide semiconductor devices containing MIM capacitors and methods for making the semiconductor devices with improved performance.

BRIEF SUMMARY OF THE DISCLOSURE

One aspect of the present disclosure includes a method of fabricating a semiconductor device containing an MIM capacitor by providing a first interlayer dielectric layer to cover a substrate. A metal-insulator-metal (MIM) capacitor is formed on the first interlayer dielectric layer. The MIM capacitor includes a bottom electrode layer and a top electrode layer that are isolated from and laterally staggered with one another. A second interlayer dielectric layer is formed to cover both the MIM capacitor and the first interlayer dielectric layer. A first conductive plug and a second conductive plug are formed to pass through the second interlayer dielectric layer. The first conductive plug contacts a sidewall and a surface portion of the top electrode layer of the MIM capacitor and the second conductive plug contacts a sidewall and a surface portion of the bottom electrode layer of the MIM capacitor.

Another aspect of the present disclosure includes a semiconductor device containing an MIM capacitor. The semiconductor device includes a substrate, a first interlayer dielectric layer, an MIM capacitor, a second interlayer dielectric layer, a first conductive plug and a second conductive plug. The first interlayer dielectric layer covers the substrate. The MIM capacitor is disposed on the first interlayer dielectric layer and includes a bottom electrode layer and a top electrode layer that are isolated from and laterally staggered with one another. The second interlayer dielectric layer covers both the MIM capacitor and the first interlayer dielectric layer. The first conductive plug and the second conductive plug pass through the second interlayer dielectric layer. The first conductive plug contacts a sidewall and a surface portion of the top electrode layer of the MIM capacitor and the second conductive plug contacts a sidewall and a surface portion of the bottom electrode layer of the MIM capacitor.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
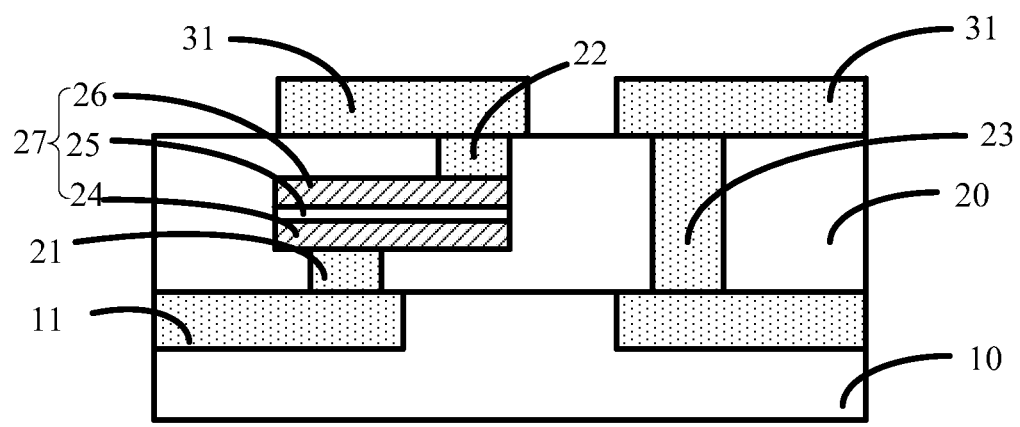
FIG. 1 is a schematic illustrating a conventional semiconductor device containing an MIM capacitor.

Referring back to FIG. 1, in the conventional semiconductor device containing an MIM capacitor, the top electrode layer 26 of the MIM capacitor is configured right above the bottom electrode layer 24, with the conductive plug 21 in contact with a surface portion of the bottom electrode layer 24 and with the conductive plug 22 in contact with a surface portion of the top electrode layer 26. With the process node reduced, the contact area between the conductive plug 21 and the bottom electrode layer 24, as well as the contact area between the conductive plug 22 and the top electrode layer 26, are further decreased. This increases the electrical resistance of semiconductor device containing the MIM capacitor and affects device performance of such semiconductor devices.

Accordingly, disclosed herein provides a semiconductor device containing an MIM capacitor with an enhanced performance and a fabrication method for making the same. A top electrode layer and a bottom electrode layer of the disclosed semiconductor device are laterally staggered such that the conductive plugs are formed to respectively contact a sidewall and a surface portion of the top electrode layer, as well as a sidewall and a surface portion of the bottom electrode layer. Accordingly, with the conductive plugs scaled down, the contact areas between the conductive plugs and each of the top electrode layer and the bottom electrode layer can be increased to lower the electrical resistance, hence effectively improving the performance of the semiconductor devices containing MIM capacitors.

Figure 11:
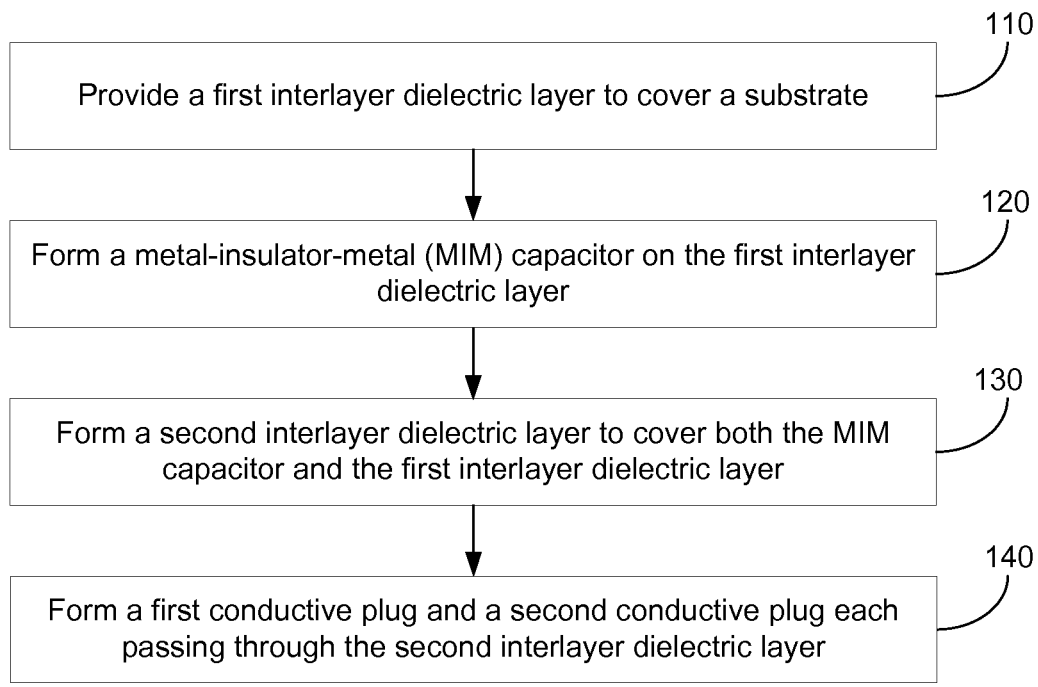
FIG. 11 depicts an exemplary method for forming a semiconductor device containing an MIM capacitor in accordance with various disclosed embodiments.

FIGS. 2-9 depict cross-sectional views of an exemplary semiconductor device containing an MIM capacitor at various stages during its formation, while FIG. 11 depicts an exemplary method for forming the semiconductor device containing an MIM capacitor.

Figure 2:
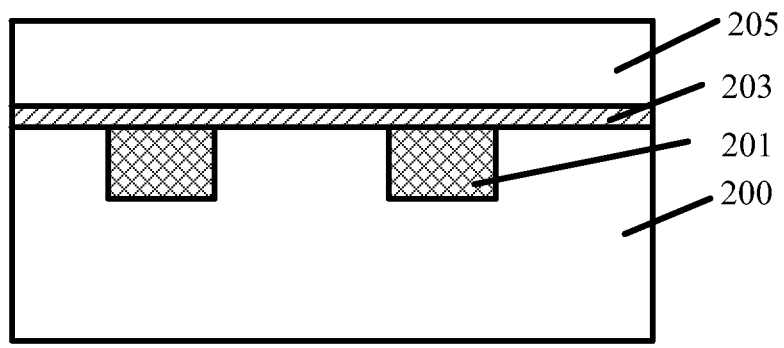
FIGS. 2-9 depict cross-sectional views of an exemplary semiconductor device containing an MIM capacitor at various stages during its formation in accordance with various disclosed embodiments.

In FIG. 2, a substrate 200 is provided and used as a platform for subsequent processes. A first interlayer dielectric layer 205 is formed on the substrate 200 (e.g., Step 110 of FIG. 11). The substrate 200 includes a semiconductor base (not shown) and an initial interlayer dielectric layer (not shown) on the surface of the semiconductor base. The semiconductor base can be made of single crystalline silicon, single crystalline germanium, Group III-V compounds, or silicon-on-insulator, etc. The initial interlayer dielectric layer can be made of low-K materials, ultra-low-K materials, or oxides, etc.

In an exemplary embodiment, the formation method further includes: forming a metal interconnect layer 201 in the substrate 200, specifically, in the initial interlayer dielectric layer, to connect components configured within the semiconductor base for transmitting signal. The metal interconnect layer 201 is made of Cu, W, and/or Al. In one embodiment, the formation method further includes forming transistors and other suitable devices in the substrate 200.

The first interlayer dielectric layer 205 is utilized to isolate the substrate 200 from an MIM capacitor to be formed. The first interlayer dielectric layer 205 is made of low-k materials, ultra-low K materials or oxides. The first interlayer dielectric layer 205 is created by a chemical vapor deposition process or other deposition process to better isolate the substrate 200 from the MIM capacitor to reduce parasitic capacitance. In an exemplary embodiment, the first interlayer dielectric layer 205 is made of silicon oxide and is created by a chemical vapor deposition process.

Optionally, an etch stop layer 203 is also formed to cover both the substrate 200 and the interconnect metal layer 201 to protect the interconnect metal layer 201 in the substrate 200 from being damaged in subsequent etching processes. The first interlayer dielectric layer 205 covers the surface of the etch stop layer 203. The etch stop layer 203 is made of materials (e.g., silicon nitride) having an etching rate greater than the materials for forming the first interlayer dielectric layer 205, e.g., under same process conditions.

Figure 3:
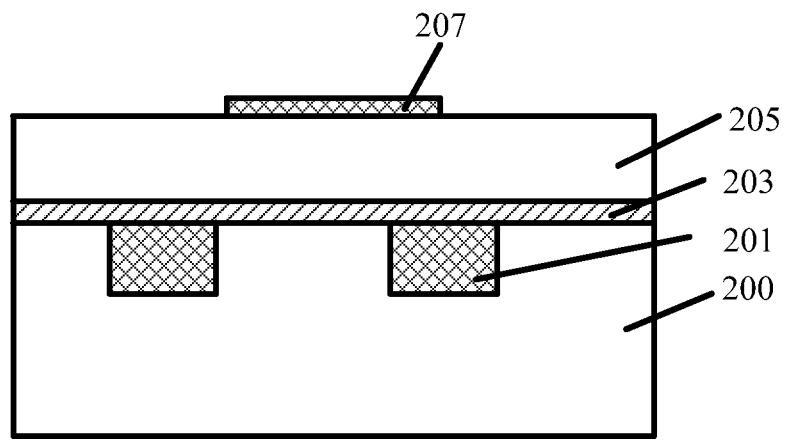

In FIG. 3, a bottom electrode layer 207 is formed on the surface of the first interlayer dielectric layer 205 to be subsequently used as the bottom electrode of the MIM capacitor to be formed. The bottom electrode layer 207 can be formed by, for example, depositing a bottom electrode thin film (not shown) to cover the first interlayer dielectric layer 205, forming a photoresist layer on the surface of bottom electrode thin film to define a dimension of the bottom electrode layer, and forming the bottom electrode layer 207 by etching the bottom electrode thin film using the photoresist layer as mask. The bottom electrode layer 207 is created by a physical vapor deposition process, a chemical vapor deposition process, or a sputtering process. The bottom electrode layer 207 is made of titanium nitride, titanium, tantalum nitride, tantalum and/or a combination thereof. In one embodiment, the bottom electrode layer 207 is made of tantalum and is created by a sputtering process.

Figure 4:
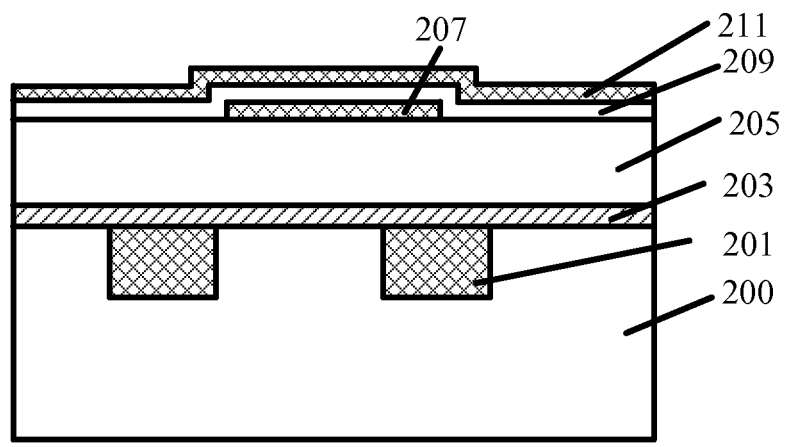

In FIG. 4, an isolation thin film 209 is conformally coated to cover the surface of the bottom electrode layer 207. A top electrode thin film 211 is formed to cover the isolation thin film 209. The isolation thin film 209 is employed subsequently to form an isolation layer and is coated by a chemical vapor deposition process. The isolation thin film 209 is made of high-K materials, silicon oxide, silicon nitride, etc. In one embodiment, the isolation thin film 209 is made of high-K materials.

The top electrode thin film 211 is subsequently used to form the top electrode layer. The top electrode thin film 211 is created by a physical vapor deposition process, a chemical vapor deposition process, or a sputtering process. The top electrode thin film 211 is made of titanium nitride, titanium, tantalum nitride, tantalum and/or a combination thereof. In one embodiment, the top electrode thin film 211 and the bottom electrode layer 207 can be made of a same material, e.g., tantalum, formed by a sputtering process.

Figure 5:
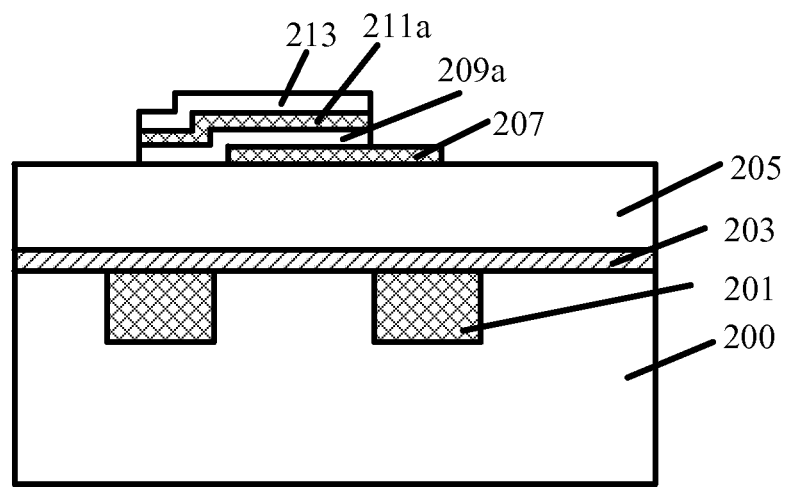

In FIG. 5, a first mask layer 213 is formed on the surface of the top electrode thin film 211 (as shown in FIG. 4). By utilizing the first mask layer 213 as a mask, the top electrode thin film 211 and the isolation thin film 209 (as shown in FIG. 4) is etched to expose the bottom electrode layer 207 to form an isolation layer 209a, and a top electrode layer 211a covering the isolation layer 209a. The first mask layer 213 used as a mask to etch the top electrode thin film 211 and the isolation thin film 209, can be made of a material having an etching rate greater than the materials for forming both the top electrode thin film 211 and the isolation thin film 209. In an exemplary embodiment, the first mask layer 213 is made of a photoresist material.

Referring back to FIG. 1, the contact area between the conductive plug 21 and the bottom electrode layer 21 and the contact area between the conductive plug 22 and the top electrode layer 26 are smaller in the conventional semiconductor devices containing MIM capacitors, which affects the electrical resistance of such conventional semiconductor devices.

As disclosed herein, when the bottom electrode layer 207 and the top electrode layer 211a are configured to be laterally staggered, the subsequently formed conductive plugs can be in contact with a surface portion of the bottom electrode layer 207 (or the top electrode layer 211a), and also be in contact with the sidewall of the bottom electrode layer 207 (or the top electrode layer 211a). This can effectively increase the contact area between the conductive plugs and the bottom electrode layer 207 or the top electrode layer 211a to reduce the electrical resistance of the formed semiconductor device.

The top electrode layer 211a, formed by etching the top electrode thin film 211 and the isolation thin film 209, is laterally staggered with the bottom electrode layer 207. Etching the top electrode thin film 211 and the isolation thin film 209 is accomplished by an anisotropic dry etching process, and the etching process stops upon exposing the bottom electrode layer 207 to form the isolation layer 209a and the top electrode layer 211a.

As disclosed herein, that the top electrode layer 211a is laterally staggered with the bottom electrode layer 207 means: in a direction parallel to the surface of the substrate 200, only a portion of the bottom electrode layer 207 is configured having a portion of the top electrode layer 211a there-above (e.g., in a direction perpendicular to the surface of the substrate 200). On/over a remaining portion of the bottom electrode layer 207, a second interlayer dielectric layer and a conductive plug can be formed subsequently. Underneath a remaining portion of the top electrode layer 211a, the first interlayer dielectric layer 205 (not the bottom electrode layer 207) is included. In some cases, that the top electrode layer 211a is laterally staggered with the bottom electrode layer 207 means: only a portion of the bottom electrode layer 207 faces (or overlaps in a direction perpendicular to the surface of the substrate 200 with) only a portion of the top electrode layer 211a to form the desired MIM capacitor.

The isolation layer 209a is used to isolate the bottom electrode layer 207 from the top electrode layer 211a. The isolation layer 209a is made of a same material for forming the isolation thin film 209 (including, e.g., high-K materials, silicon oxide, silicon nitride, etc.). In an exemplary embodiment, the isolation layer 209a is made of a high-K material.

The top electrode layer 211a is used to be the top electrode of an MIM capacitor, and is laterally staggered with the bottom electrode layer 207 to increase the contact area between the top electrode layer 211a and a corresponding conductive plug as well as the contact area between the bottom electrode layer 207 and a corresponding conductive plug. The top electrode layer 211a is made of a same material (including e.g., titanium nitride, titanium, tantalum nitride, tantalum, and/or a combination thereof) for forming the top electrode thin film 211. In an exemplary embodiment, both the top electrode layer 211a and the bottom electrode layer 207 are made of tantalum.

Note that, the metal interconnect layer 201 is formed inside the substrate 200 such that the subsequently formed conductive plugs can be electrically connected to both the metal interconnect layer 201 and the bottom electrode layer 207 (or the top electrode layer 211a). For example, the formed MIM capacitor can reside in a region between neighboring metal interconnect layers 201. The formed MIM capacitor can thus include the top electrode layer 211a, the isolation layer 209a, and the bottom electrode layer 207 that fall within the region between the neighboring metal interconnect layers 201 (e.g., Step 120 of FIG. 11). In this case, steps of forming conductive plugs can be reduced.

Figure 6:
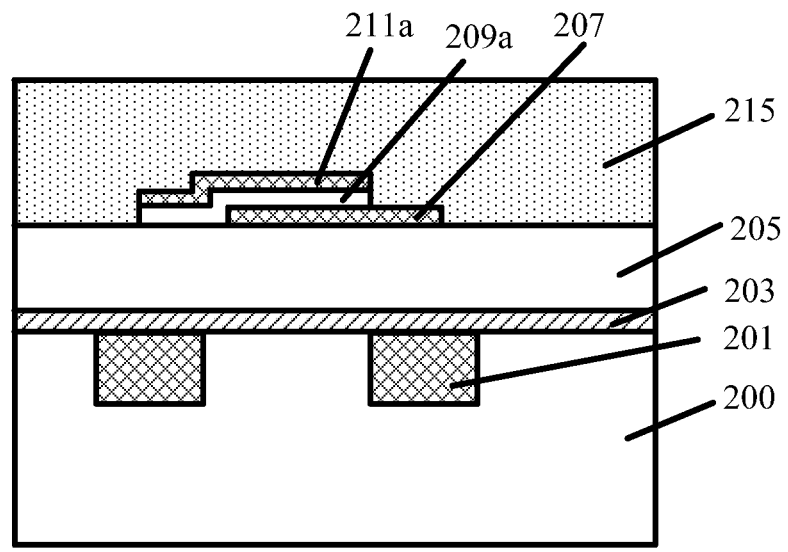

In FIG. 6, the first mask layer 213 is removed, after forming the isolation layer 209a and the top electrode layer 211a, to facilitate subsequent processes. The removal of the first mask layer 213 is accomplished by an etching process or an ashing process. As shown in FIG. 6, a second interlayer dielectric layer 215 is formed on the surface of the MIM capacitor and the first interlayer dielectric layer 205 (e.g., Step 130 of FIG. 11), which is subsequently etched to form a first opening and a second opening. The second interlayer dielectric layer 215 is formed by a chemical vapor deposition process. The second interlayer dielectric layer 215 is made of low-K materials, ultra-low-K materials, fluorosilicate glass, and/or oxides to reduce the parasitic capacitance. In an exemplary embodiment, fluorosilicate glass can be used to form a second interlayer dielectric layer 215 to provide a desired quality. The formed semiconductor device can thus have a small parasitic capacitance.

Figure 7:
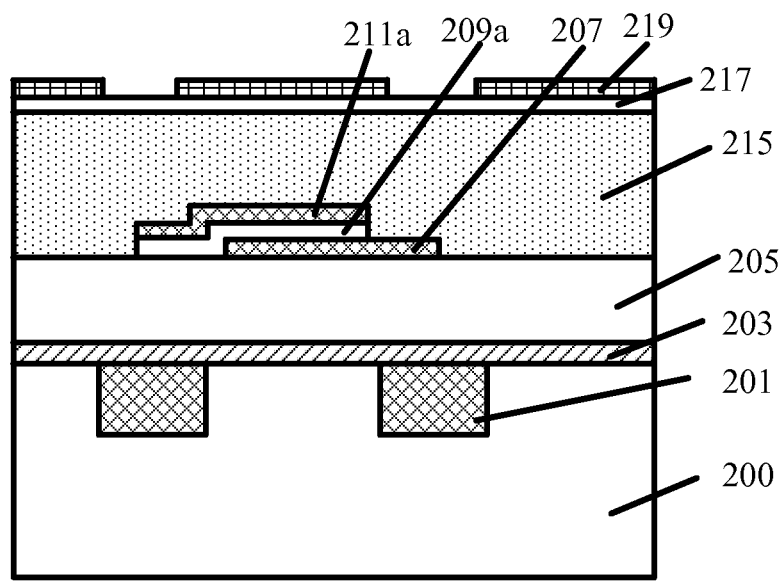

In FIG. 7, a metal hard-mask layer 217 is formed covering the second interlayer dielectric layer 215. A second mask layer 219 is formed on the surface of the metal hard-mask layer 217 to define positions of first and second conductive plugs. The metal hard-mask layer 217 is used to protect the remaining layer of the second interlayer dielectric layer 215 from being damaged in the subsequent processes. In one embodiment, the metal hard-mask layer 217 is made of titanium nitride and formed by a chemical vapor deposition process.

The second mask layer 219 is utilized as a mask to subsequently etch the second interlayer dielectric layer 215 to form a first opening and a second opening defining the positions of the first and second conductive plugs respectively. A material for forming the second mask layer 219 has an etching rate greater than the material for forming the second interlayer dielectric layer 215. In an exemplary embodiment, the second mask layer 219 is made of a photoresist material having a formation process including exposure and development. In other embodiments, the second mask layer 219 can also be formed directly on the surface of the second interlayer dielectric layer 215 without forming the metal hard-mask layer 217.

Figure 8:
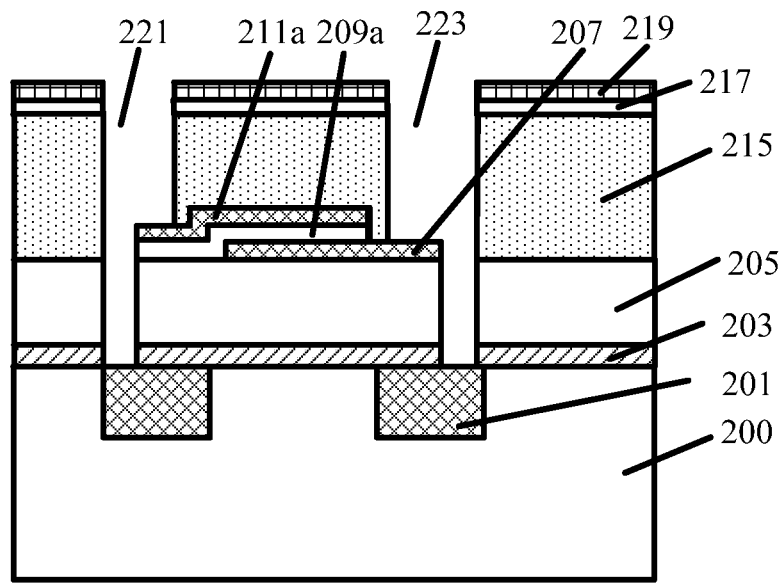

In FIG. 8, the second interlayer dielectric layer 215 is etched using the second mask layer 219 as an etch mask to form a first opening 221 and a second opening 223. The first opening 221 exposes a sidewall and surface portion of the top electrode layer 211a of the MIM capacitor. The second opening 223 exposes a sidewall and surface portion of the bottom electrode layer 207 of the MIM capacitor.

Etching the second interlayer dielectric layer 215 is performed by a dry etching process to form the first opening 221 and the second opening 223. The first opening 221 exposing the sidewall and surface portion of the top electrode layer 211a of the MIM capacitor is subsequently used to form a first conductive plug contacting the sidewall and surface portion of the top electrode layer 211a. The second opening 223 exposing the sidewall and surface portion of the bottom electrode layer 207 of the MIM capacitor is subsequently used to form a second conductive plug contacting the sidewall and surface portion of the bottom electrode layer 207.

In one embodiment, each of the first opening 221 and the second opening 223 also exposes a surface portion of the metal interconnect layer 201 such that the formed first and second conductive plugs can connect electrically to the corresponding metal interconnect layer 201. Thus, after etching the second interlayer dielectric layer 215 using the second mask layer as mask in this embodiment, the first interlayer dielectric layer 205 and the etching stop layer 203 are also subsequently etched. Due to the etching stop layer 203, the metal interconnect layer 201 is not be damaged upon stopping of the etching process when etching the stop layer 203 is completed. Device performance of the semiconductor devices can be improved.

Figure 9:
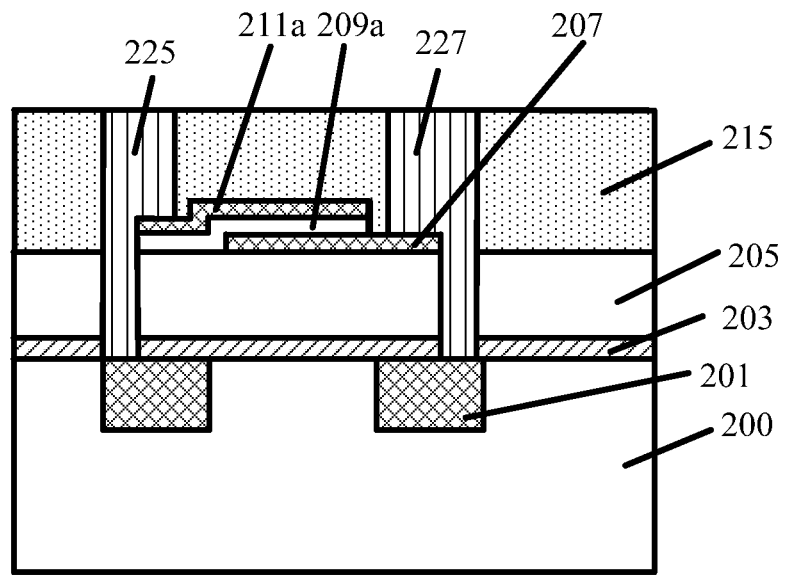

In FIG. 9, the first opening 221 (as shown in FIG. 8) and the second opening 223 (as shown in FIG. 8) are filled with electrically conductive materials to form a first conductive plug 225 and a second conductive plug 227 accordingly (e.g., Step 140 of FIG. 11).

The first conductive plug 225 formed by filling the first opening 221 with electrically conductive material(s) is used to connect electrically the top electrode layer 211a with the metal interconnect layer 201. Because the first opening 221 exposes the sidewall and surface portion of the top electrode layer 211a of the MIM capacitor, the first conductive plug 225 contacts both the sidewall and the surface portion of the top electrode layer 211a to increase the contact area between the first conductive plug 225 and the top electrode layer 211a. This can thus lower the electrical resistance of the semiconductor device and increase the capacitance of the semiconductor device. The first conductive plug 225 can be made of a desired electrically conductive material such as Cu, W and/or Al.

The second conductive plug 227 formed by filling the second opening 223 with electrically conductive material(s) is used to connect electrically the bottom electrode layer 207 with the metal interconnect layer 201. Because the second opening 223 exposes the sidewall and surface portion of the bottom electrode layer 207 of the MIM capacitor, the second conductive plug 227 contacts both the sidewall and the surface portion of the bottom electrode layer 207 to increase the contact area between the second conductive plug 227 and the bottom electrode layer 207. This can thus lower the electrical resistance of the semiconductor device and increase the capacitance of the semiconductor device. The second conductive plug 227 can be made of a desired electrically conductive material such as Cu, W and/or Al.

In some embodiment, both the first conductive plug 225 and the second conductive plug 227 can be made of a same material, e.g., Cu by a same process. In other embodiments, the first conductive plug 225 and the second conductive plug 227 can be made of a different material.

Since the top electrode layer of the formed MIM capacitor is laterally staggered with the bottom electrode layer, the first conductive plug subsequently formed can contact both the sidewall and the surface portion of the top electrode layer of the MIM capacitor to increase the contact area between the first conductive plug and the top electrode layer. Likewise, the second conductive plug subsequently formed can contact both the sidewall and the surface portion of the bottom electrode layer of the MIM capacitor to increase the contact area between the second conductive plug and the bottom electrode layer, to facilitate fabrication of the semiconductor device with a low electrical resistance.

Accordingly, as depicted in FIG. 9, the present disclosure provides a semiconductor device containing an MIM capacitor. The device can include a substrate 200; a first interlayer dielectric layer 205 covering the substrate 200; an MIM capacitor on the surface of the first interlayer dielectric layer 205, the MIM capacitor including a bottom electrode layer 207 and a top electrode layer 211a that are laterally staggered and electrically isolated from one another; a second dielectric layer 215 covering the surface of both the MIM capacitor and the first interlayer dielectric layer 205; and a first conductive plug 225 and a second conductive plug 227 each formed through the second interlayer dielectric layer 215, the first conductive plug 225 contacting the sidewall and surface portion of the top electrode layer 211a of the MIM capacitor, and the second conductive plug 227 contacting the sidewall and surface portion of the bottom electrode layer 207 of MIM capacitor.

The substrate 200 includes a semiconductor base (not shown) and an initial interlayer dielectric layer (not shown) on surface of the semiconductor base. In an exemplary embodiment, the semiconductor device further includes a metal interconnect layer 201 in the substrate 200, specifically, in the initial interlayer dielectric layer, to connect with components inside the semiconductor base for transmitting signal.

The first interlayer dielectric layer 205 is utilized to isolate the substrate 200 from the MIM capacitor, and is made of low-k materials, ultra-low K materials and/or oxides to reduce parasitic capacitance.

In an exemplary embodiment, the semiconductor device further includes an etch stop layer 203 covering both the substrate 200 and the interconnect metal layer 201, while the first interlayer dielectric layer 205 covers the surface of the etch stop layer 203.

The bottom electrode layer 207 is subsequently used as the bottom electrode of the MIM capacitor. The bottom electrode layer 207 can be made of titanium nitride, titanium, tantalum nitride, tantalum, and/or a combination thereof. In an exemplary embodiment, the bottom electrode layer 207 is made of tantalum.

The top electrode layer 211a is used to be the top electrode of the MIM capacitor, and is laterally staggered with the bottom electrode layer 207 to increase the contact area between the top electrode layer 211a and the first conductive plug, as well as the contact area between the bottom electrode layer 207 and the second conductive plug. The top electrode layer 211a is made of titanium nitride, titanium, tantalum nitride, tantalum, and/or a combination thereof. In an exemplary embodiment, both the top electrode layer 211a and the bottom electrode layer 207 are made of tantalum.

The isolation layer 209a is used to isolate the bottom electrode layer 207 from the top electrode layer 211a, and can be made of high-K materials, silicon oxide, or silicon nitride, etc. In an exemplary embodiment, the isolation layer 209a is made of a high-K material.

A metal interconnect layer 210 is formed in the substrate 200 to electrically connect the subsequently formed conductive plugs to the bottom electrode layer 207 or the top electrode layer 211a as well as to the metal interconnect layer 201. For example, the formed MIM capacitor resides in a region between the neighboring metal interconnect layers 201. The formed MIM capacitor can include the top electrode layer 211a, the isolation layer 209a, and the bottom electrode layer 207 that fall within the region between the neighboring metal interconnect layers 201 to reduce formation steps of conductive plugs.

The second interlayer dielectric layer 215 is used to isolate neighboring conductive plugs. The second interlayer dielectric layer 215 can be made of low-K materials, ultra-low-K materials, fluorosilicate glass, and/or oxides to reduce parasitic capacitance. In an exemplary embodiment, fluorosilicate glass is used to form a second interlayer dielectric layer 215 with a desired quality to form a semiconductor device with low parasitic capacitance.

The first conductive plug 225 is used to connect electrically the top electrode layer 211a to the metal interconnect layer 201, and contacts both the sidewall and surface portion of the top electrode layer 211a. The first conductive plug 225 is made of a desired electrically conductive material such as Cu, W and/or Al. In an exemplary embodiment, the first conductive plug 225 can be disposed through both the first interlayer dielectric layer 205 and the etching stop layer 203.

The second conductive plug 227 is used to connect electrically the bottom electrode layer 207 to the metal interconnect layer 201, and contacts both the sidewall and surface portion of the bottom electrode layer 207. The second conductive plug 227 is made of a desired electrically conductive material such as Cu, W, and/or Al. In an exemplary embodiment, the second conductive plug 227 can be disposed through both the first interlayer dielectric layer 205 and the etching stop layer 203. The first conductive plug 225 and the second conductive plug 227 can be made of Cu.

In an exemplary embodiment, the top electrode layer of the formed MIM capacitor is isolated from and laterally staggered with the bottom electrode layer. When the first conductive plug is employed to electrically connect the metal interconnect layer and the top electrode layer, the first conductive plug can contact both the sidewall and surface portion of the top electrode layer to effectively increase the contact area between the first conductive plug and the top electrode layer. Similarly, the contact area between the second conductive plug and the bottom electrode layer is also effectively increased, reducing the electrical resistance of the semiconductor device containing an MIM capacitor and effectively improving the performance of the semiconductor device containing the MIM capacitor.

In various embodiments, more or less conductive plugs can be connected to an interconnect metal layer in a substrate of a semiconductor device containing an MIM capacitor. For example, instead of having first and second conductive plugs each connected to an interconnect metal layer as depicted in FIGS. 2-9, an exemplary semiconductor device containing an MIM capacitor can include a single conductive plug connected to a metal interconnect layer.

Figure 10:
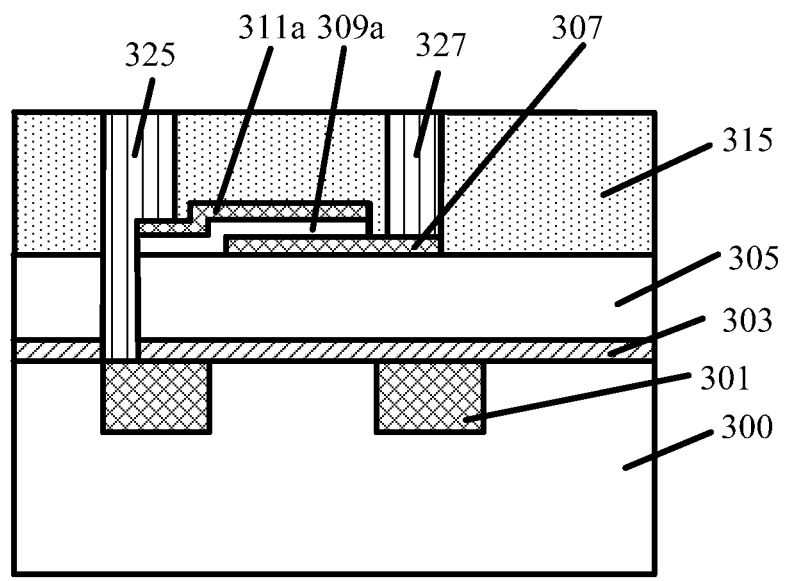
FIG. 10 depicts a cross-sectional view of another exemplary semiconductor device containing an MIM capacitor in accordance with various disclosed embodiments.

FIG. 10 depicts a cross-sectional view of another exemplary semiconductor device containing an MIM capacitor in accordance with various disclosed embodiments.

The semiconductor device of FIG. 10 can be formed by, for example, providing a first interlayer dielectric layer 305 to cover a surface of a substrate 300; forming a metal interconnect layer 301 in the substrate 300; forming an MIM capacitor on the surface of the first interlayer dielectric layer 305, the MIM capacitor including a bottom electrode layer 307 and a top electrode layer 311a that are isolated from and laterally staggered with one another; forming a second interlayer dielectric layer 315 covering the surface of both the MIM capacitor and the first interlayer dielectric layer 305; forming a first conductive plug 325 passing through both the second interlayer dielectric layer 315 and the first interlayer dielectric layer 305, the first conductive plug 325 contacting both the sidewall and surface portion of the top electrode layer of the MIM capacitor, as well as contacting the metal interconnect layer 301; and forming a second conductive plug 327 passing through the second interlayer dielectric layer 315, the second conductive plug 327 contacting both the sidewall and surface portion of the bottom electrode layer 307 of the MIM capacitor.

The use, fabrication method, and processing of the substrate 300, the first interlayer dielectric layer 305, the bottom electrode layer 307, the top electrode layer 311a, and the second interlayer dielectric layer 315 can be the same or similar to related description as disclosed above.

Optionally, an etching stop layer 303 covering the substrate 300 can be formed before the formation of the first interlayer dielectric layer 305. The etching stop layer 303 can be used to protect the substrate 300 from being damaged during the subsequent etching processes and the etching stop layer 303 can be made of, e.g., silicon nitride.

The formation of the first conductive plug 325 can include: etching the second interlayer dielectric layer 315 then the first interlayer dielectric layer 305 and the etching stop layer 303 to form a first opening (not shown) that exposes a sidewall and a surface portion of the top electrode layer 311a, and a surface portion of the metal interconnect layer 301. The first opening can then be filled with electrically conductive materials to form the first conductive plug 325. The first conductive plug 325 connects electrically the top electrode layer 311a to the metal interconnect layer 301 for transmitting signal. Moreover, the contact area between the first conductive plug 325 and the top electrode layer 311a is desirably large to lower the electrical resistance and to improve the performance of the semiconductor device containing the MIM capacitor.

The formation of the second conductive plug 327 can include: etching the second interlayer dielectric layer 315 to form a second opening (not shown) that exposes a sidewall and a surface portion of the bottom electrode layer 307. The second opening can then be filled with electrically conductive material(s) to form the second conductive plug 327. The second conductive plug 327 connects electrically to the bottom electrode layer 307 for transmitting signal. Similarly, the contact area between the second conductive plug 327 and the bottom electrode layer 307 is desirably large to lower the electrical resistance and to improve the performance of the semiconductor device containing the MIM capacitor.

The fabrication method of semiconductor device containing the MIM capacitor can further include forming a metal hard-mask layer (not shown) covering the second interlayer dielectric layer 315 before the formation of the first opening and the second opening. The metal hard-mask layer protects the un-etched portion of the second interlayer dielectric layer 315 from be damaged.

In other embodiments, the fabrication method of semiconductor device containing an MIM capacitor can include: forming a first conductive plug (not shown in FIG. 10) passing through the second interlayer dielectric layer 315 to contact both the sidewall and surface portion of the top electrode layer of the MIM capacitor; while forming a second conductive plug (not shown in FIG. 10) passing through the second interlayer dielectric layer 315 and the first interlayer dielectric layer 305 to contact both the sidewall and surface portion of the bottom electrode layer 307 of the MIM capacitor, as well as contact the metal interconnect layer 301.

As disclosed herein, in addition to reducing electrical resistance of the semiconductor device containing the MIM capacitor, the formed first conductive plug or the second conductive plug contacts the metal interconnect layer such that the metal interconnect layer can transmit signal through at least one of the conductive plugs. Such signal transmission is flexible and the fabrication process is simple.

Accordingly, the exemplary semiconductor device containing the MIM capacitor as shown in FIG. 10 can include a substrate 300; a first interlayer dielectric layer 305 covering the substrate; a metal interconnect layer 301 disposed in the substrate 300; an MIM capacitor disposed on the surface of the first interlayer dielectric layer 305, the MIM capacitor including a bottom electrode layer 307 and a top electrode layer 311a that are isolated from and laterally staggered with one another; a second interlayer dielectric layer 315 covering the surface of both the MIM capacitor and the first interlayer dielectric layer 305; a first conductive plug 325 passing through the second interlayer dielectric layer 315 and the first interlayer dielectric layer 305, the first conductive plug contacting the sidewall and surface portion of the top electrode and contacting the metal interconnect layer 301; and a second conductive plug 327 passing through the second interlayer dielectric layer 315, the second conductive plug 327 contacting the sidewall and surface portion of the bottom electrode layer 307 of the MIM capacitor.

The MIM capacitor is positioned in a region between neighboring metal interconnect layers 301, and the first conductive plug passes through the first interlayer dielectric layer 305 and contacts electrically with the metal interconnect layer 301.

In addition, in the semiconductor device containing the MIM capacitor as shown in FIG. 10, a first conductive plug (not shown) can pass through the second interlayer dielectric layer 315 and contact the sidewall and surface portion of the top electrode layer of the MIM capacitor, while a second conductive plug (not shown) can pass through both the second interlayer dielectric layer 315 and the first interlayer dielectric layer 305 to contact the sidewall and surface portion of the bottom electrode layer 307 of the MIM capacitor and to contact the metal interconnect layer 301. Related information can refer to FIGS. 2-9 and is not repeated herein.

As disclosed herein, the semiconductor device containing the MIM capacitor can have low resistance and desired performance. The formed first conductive plug or the second conductive plug contacts the metal interconnect layer in a manner such that signal transmission between the metal interconnect layer and the external signal can be flexible and the semiconductor device containing the MIM capacitor can have a simple structure.

In this manner, contrary to conventional MIM capacitors wherein the top electrode layer is right above the bottom electrode layer having substantially entire surfaces face one another, the disclosed MIM capacitor can have a top electrode layer and a bottom electrode layer isolated from and laterally staggered with one another. The subsequently-formed first conductive plug can not only contact a surface portion of the top electrode layer but also a sidewall of the top electrode layer. Similarly, the second conductive plug can contact both a sidewall and surface portion of the bottom electrode layer. Thus, the contact area between the first conductive plug and the top electrode layer, and the contact area between the second conductive plug and the bottom electrode layer can be increased to effectively lower the electrical resistance and to improve the performance of the semiconductor device containing the MIM capacitor.

Further, the first conductive plug and/or the second conductive plug can connect electrically to the metal interconnect layer with simple formation process. Signal transmission between the metal interconnect layer and the external signal is in a flexible manner. The semiconductor device containing the MIM capacitor can have desired device performance.

Other applications, advantages, alternations, modifications, or equivalents to the disclosed embodiments are obvious to those skilled in the art.

What is claimed is:

1. A method of fabricating a semiconductor device containing an MIM capacitor, comprising:
   providing a first interlayer dielectric layer to cover a substrate;
   providing a metal interconnect layer in the substrate;
   forming a metal-insulator-metal (MIM) capacitor on the first interlayer dielectric layer, wherein the MIM capacitor includes a bottom electrode layer and a top electrode layer that are isolated from and laterally staggered with one another;
   forming a second interlayer dielectric layer to cover both the MIM capacitor and the first interlayer dielectric layer; and
   forming a first conductive plug and a second conductive plug each passing through the second interlayer dielectric layer, wherein the first conductive plug contacts a sidewall and a surface portion of the top electrode layer of the MIM capacitor and the second conductive plug contacts a sidewall and a surface portion of the bottom electrode layer of the MIM capacitor, and wherein at least one of the first conductive plug and the second conductive plug passes through the first interlayer dielectric layer and connects electrically with the metal interconnect layer.

2. The fabrication method of claim 1, wherein forming the MIM capacitor includes:
   forming the bottom electrode layer on the first interlayer dielectric layer,
   forming an isolation thin film covering the bottom electrode layer,
   forming a top electrode thin film covering the isolation thin film,
   forming a first mask layer on the top electrode thin film,
   etching the top electrode thin film and the isolation thin film using the first mask layer as an etch mask to expose the bottom electrode layer to form an isolation layer and a top electrode layer covering the isolation layer, and
   removing the first mask layer upon formation of the isolation layer and the top electrode layer.

3. The fabrication method of claim 1, wherein forming the first conductive plug and the second conductive plug includes:
   forming a second mask layer on the second interlayer dielectric layer to define positions of the first conductive plug and the second conductive plug to be formed,
   etching the second interlayer dielectric layer using the second mask layer as an etch mask to form a first opening to expose the sidewall and the surface portion of the top electrode layer of the MIM capacitor, and to form a second opening to expose the sidewall and the surface portion of the bottom electrode layer of the MIM capacitor, and
   filling the first opening and the second opening with an electrically conductive material to form the first conductive plug and the second conductive plug, respectively.

4. The fabrication method of claim 1, wherein the MIM capacitor is disposed in a region between neighboring metal interconnect layers in the substrate.

5. The fabrication method of claim 1, further including forming an etching stop layer covering the substrate and the metal interconnect layer, wherein the first interlayer dielectric layer covers the etching stop layer.

6. The fabrication method of claim 1, further including forming a metal hard-mask layer covering the second interlayer dielectric layer prior to forming the first conductive plug and the second conductive plug.

7. The fabrication method of claim 6, wherein the metal hard-mask layer is made of titanium nitride.

8. The fabrication method of claim 1, wherein the first interlayer dielectric layer is made of a low-K material, an ultra-low-K material, or an oxide, and the second interlayer dielectric layer is made of a low-K material, an ultra-low-K material, a fluorosilicate glass or an oxide.

9. The fabrication method of claim 1, wherein the bottom electrode layer is made of titanium nitride, titanium, tantalum nitride, tantalum, or a combination thereof, and the top electrode layer is made of titanium nitride, titanium, tantalum nitride, tantalum, or a combination thereof.

10. The fabrication method of claim 1, wherein only a portion of the bottom electrode layer faces or overlaps with only a portion of the top electrode layer, wherein the portion of the bottom electrode layer and the portion of the top electrode layer are isolated by an isolation layer.

11. A semiconductor device containing an MIM capacitor comprising:
   a substrate;
   a first interlayer dielectric layer covering the substrate;
   a metal interconnect layer disposed in the substrate;
   an MIM capacitor disposed on the first interlayer dielectric layer, wherein the MIM capacitor includes a bottom electrode layer and a top electrode layer that are isolated from and laterally staggered with one another;
   a second interlayer dielectric layer covering both the MIM capacitor and the first interlayer dielectric layer; and
   a first conductive plug and a second conductive plug passing through the second interlayer dielectric layer, wherein the first conductive plug contacts a sidewall and a surface portion of the top electrode layer of the MIM capacitor and the second conductive plug contacts a sidewall and a surface portion of the bottom electrode layer of the MIM capacitor, wherein at least one of the first conductive plug and the second conductive plug passes through the first interlayer dielectric layer and connects electrically to the metal interconnect layer.

12. The semiconductor device of claim 11, wherein the MIM capacitor is disposed in a region between neighboring metal interconnect layers.

13. The semiconductor device of claim 11, further including an etching stop layer covering the substrate and the metal interconnect layer, wherein the first interlayer dielectric layer covers the etching stop layer.

14. The semiconductor device of claim 11, wherein only a portion of the bottom electrode layer faces or overlaps with only a portion of the top electrode layer, wherein the portion of the bottom electrode layer and the portion of the top electrode layer are isolated by an isolation layer.

15. The semiconductor device of claim 11, wherein the first interlayer dielectric layer is made of a low-K material, an ultra-low-K material, or an oxide, and the second interlayer dielectric layer is made of a low-K material, an ultra-low-K material, a fluorosilicate glass or an oxide.

16. The semiconductor device of claim 11, wherein each of the bottom electrode layer and the top electrode layer is made of a material including titanium nitride, titanium, tantalum nitride, tantalum, or a combination thereof.

* * * * *